United States Patent [19]
Comita et al.

[11] Patent Number: 6,153,260
[45] Date of Patent: *Nov. 28, 2000

[54] METHOD FOR HEATING EXHAUST GAS IN A SUBSTRATE REACTOR

[75] Inventors: Paul B. Comita, Menlo Park; David K. Carlson, Santa Clara; Norma B. Riley, Pleasanton; Doria W. Fan, San Francisco; Rekha Ranganathan, Sunnyvale, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,955

[22] Filed: Apr. 11, 1997

[51] Int. Cl.$^7$ .................................................. C23C 16/00
[52] U.S. Cl. .................................. 427/255.23; 427/248.1; 118/719; 118/728
[58] Field of Search ............................. 427/248.1, 255.1, 427/255.23; 118/715, 719, 728, 730

[56] References Cited

U.S. PATENT DOCUMENTS

| | | | |
|---|---|---|---|
| 4,976,996 | 12/1990 | Monkowski et al. | 427/255.5 |
| 5,133,284 | 7/1992 | Thomas et al. | 427/248.1 |
| 5,275,976 | 1/1994 | Moslehi | 118/715 |
| 5,326,725 | 7/1994 | Sherstinsky et al. | 427/248.1 |
| 5,383,971 | 1/1995 | Selbrede | 118/724 |
| 5,445,677 | 8/1995 | Kawata et al. | |
| 5,516,367 | 5/1996 | Lei et al. | 118/725 |
| 5,547,570 | 8/1996 | Schmitz et al. | 118/715 |
| 5,578,532 | 11/1996 | Van De Ven et al. | 427/248.1 |
| 5,614,247 | 3/1997 | Barbee et al. | 427/8 |
| 5,871,586 | 2/1999 | Crawley et al. | 118/724 |

FOREIGN PATENT DOCUMENTS

| | | |
|---|---|---|
| 60273819 | 6/1987 | European Pat. Off. . |
| 61065880 | 10/1987 | European Pat. Off. . |
| 0445596 | 9/1991 | European Pat. Off. . |
| 0606751 | 7/1994 | European Pat. Off. . |
| 4142877 | 7/1992 | Germany . |

*Primary Examiner*—Shrive Beck
*Assistant Examiner*—Bret Chen
*Attorney, Agent, or Firm*—Blakely, Sokoloff, Taylor & Zafman

[57] ABSTRACT

The present invention is a single wafer reactor having a vented lower liner for heating exhaust gas. The apparatus of the present invention includes a reaction chamber. A wafer support member which divides the chamber into an upper and lower portion is positioned within the chamber. A gas outlet for exhausting gas from the chamber has a vent to exhaust gas from the lower portion of the chamber and an exhaust passage opening to exhaust gas from the upper portion of the chamber. Heated inert purge gas is fed from the lower chamber portion through the vent at a rate so as to prevent the deposition gas from condensing in the exhaust passage.

6 Claims, 5 Drawing Sheets

METHOD FOR HEATING EXHAUST GAS IN A SUBSTRATE REACTOR

BACKGROUND OF THE INVENTION

1) Field of the Invention

The present invention relates to semiconductor processing equipment, more particularly, to a method and apparatus for reducing particle contamination in a semiconductor processing apparatus.

2) Discussion of Related Art

One type of processing apparatus for semiconductor wafers is a single wafer processor in which one wafer at a time is processed in a processing chamber. An example of a single wafer reactor is shown in FIG. 1. A susceptor 120 divides a chamber 112 into one portion which is below the susceptor (the lower portion) 124, and a second portion which is above the susceptor (the upper portion) 122. The susceptor 120 is generally mounted on a shaft 126 which rotates the susceptor about its center to achieve a more uniform processing of the wafer. A flow of a processing gas, such as a deposition gas 115, is provided in the upper portion 122 of the chamber. The chamber generally has a gas inlet passage 178 at one side thereof, and a gas exhaust passage 116 at an opposite side to achieve a flow of the processing gas across the wafer. The susceptor 120 is heated in order to heat the wafer to a desired processing temperature. One method used to heat the susceptor is by the use of lamps 134 provided around the chamber and directing their light into the chamber and onto the susceptor 120. In order to control the temperature to which the wafer is being heated, the temperature of the susceptor is constantly measured. This is often achieved by means of an infrared temperature sensor 136 which detects the infra-red radiation emitted from the heated susceptor.

A problem with this type of processing apparatus is that some of the processing gas, which is often a gas or mixture of gases for depositing a layer of a material on the surface of the wafer, tends to flow around the edge of the susceptor and deposits a layer of the material on the back surface of the susceptor. Since the deposited material is generally different from the material of the susceptor, the deposited layer has an emissivity which is different from that of the emissivity of the susceptor. Thus, once the layer of the material is deposited on the back surface of the susceptor, the infrared temperature sensor detects a change caused by the change in the emissivity of the surface from which the infra-red radiation is emitted. This change indicates a change in temperature of the susceptor which actually does not exist.

One technique which has been used to prevent the problem of deposits on the back surface of the susceptor is to provide a flow of an inert gas 121, such as hydrogen, into the lower portion of the chamber at a pressure slightly greater than that of the deposition gas in the upper portion of the chamber. One apparatus for achieving this is described in the commonly assigned application for U.S. Patent of Roger N. Anderson et al., Ser. No. 08/099/977, filed Jul. 30, 1993, entitled "Gas Inlets For Wafer Processing Chamber". Since the inert gas in the lower portion of the chamber is at a higher pressure, it will flow around the edge of the susceptor from the lower portion of the chamber and into the upper portion of the chamber. This flow of the inert gas prevents the flow of the deposition gas 115 into the lower portion of the chamber. Unfortunately, however, as the purge gas flows from the lower portion of the chamber to the upper portion of the chamber in order to exit through the exhaust passage 116 located in the upper portion 122 of chamber 122, it carries metal contaminants from the lower portion of the chamber into the upper portion, resulting in contamination of wafers being processed.

Another problem associated with the processing apparatus of FIG. 1 is that as deposition gas 115 exits the chamber through exhaust passage 116, the deposition gas cools and condenses to form deposits 114 within the exhaust passage 116. Deposition gas cools because the apparatus of FIG. 1 is a "cold wall reactor". That is, the sidewall of the deposition chamber is at a substantially lower temperature than is susceptor 120 (and wafer) during processing because the sidewall is not directly irradiated by lamp 134 due to reflectors 135 and because cooling fluid is circulated through the sidewall. Since the sidewall and the exhaust outlet passage are at a lower temperature, the deposition gas heated by susceptor 120 cools while in the passage and forms deposits 114 therein. These deposits 114 can find their way back into chamber 112 and onto the wafer being processed. Deposits 114 can detrimentally affect film quality and uniformity which can result in a substantial decrease in device yield.

Thus, what is desired is a method and apparatus which can reduce the formation of deposits in the exhaust passage and which can reduce metal contamination from the lower portion of the chamber.

SUMMARY OF THE INVENTION

The present invention is a single wafer reactor having a vented lower liner for heating exhaust gas. The apparatus of the present invention includes a reaction chamber. A wafer support member which dividers the chamber into an upper and lower portion is positioned within the chamber. An exhaust channel is formed in the sidewall of the reaction chamber to exhaust gas from within the chamber. Deposition gas is exhausted through an exhaust passage located between the upper portion of the chamber and the exterior sidewall of the deposition chamber. A high flow rate of heated purge gas is exhausted from the lower portion of the chamber through a vent located between the lower portion of the chamber and the exhaust passage. The high flow rate of heated purge gas into the exhaust passage prevents the exhausted deposition gas from condensing in the exhaust passage and forming deposits therein.

DETAILED DESCRIPTION OF THE PRESENT INVENTION

The present invention describes a method and apparatus for preventing the condensation of deposition gas in the exhaust passage of a single wafer processing reactor. In the following description numerous specific details are set forth such as specific heating elements, gases, etc., in order to provide a thorough understanding of the invention. In other instances, well known reactor features and processes have not been explained in detail in order to not unnecessarily obscure the present invention.

The present invention is a single wafer reactor. A susceptor for holding a wafer to be processed is positioned within a deposition chamber and divides the chamber into an upper portion and a lower portion. Deposition gas which feeds into the upper portion of the chamber and across the wafer is exhausted through an exhaust passage which extends from the upper portion of the chamber and out through a sidewall in the deposition chamber. An inert gas, such as $H_2$, is fed into the lower portion of the chamber and is exhausted through a vent formed between the lower portion of the chamber and the exhaust passage. A high inert purge gas flow, rate provides a large amount of heated gas into the exhaust passage which prevents the deposition gases from condensing and forming deposits therein. Additionally, by exhausting the purge gas directly from the lower portion of the chamber, metal contamination from the lower portion of the chamber is reduced.

Figure 1:
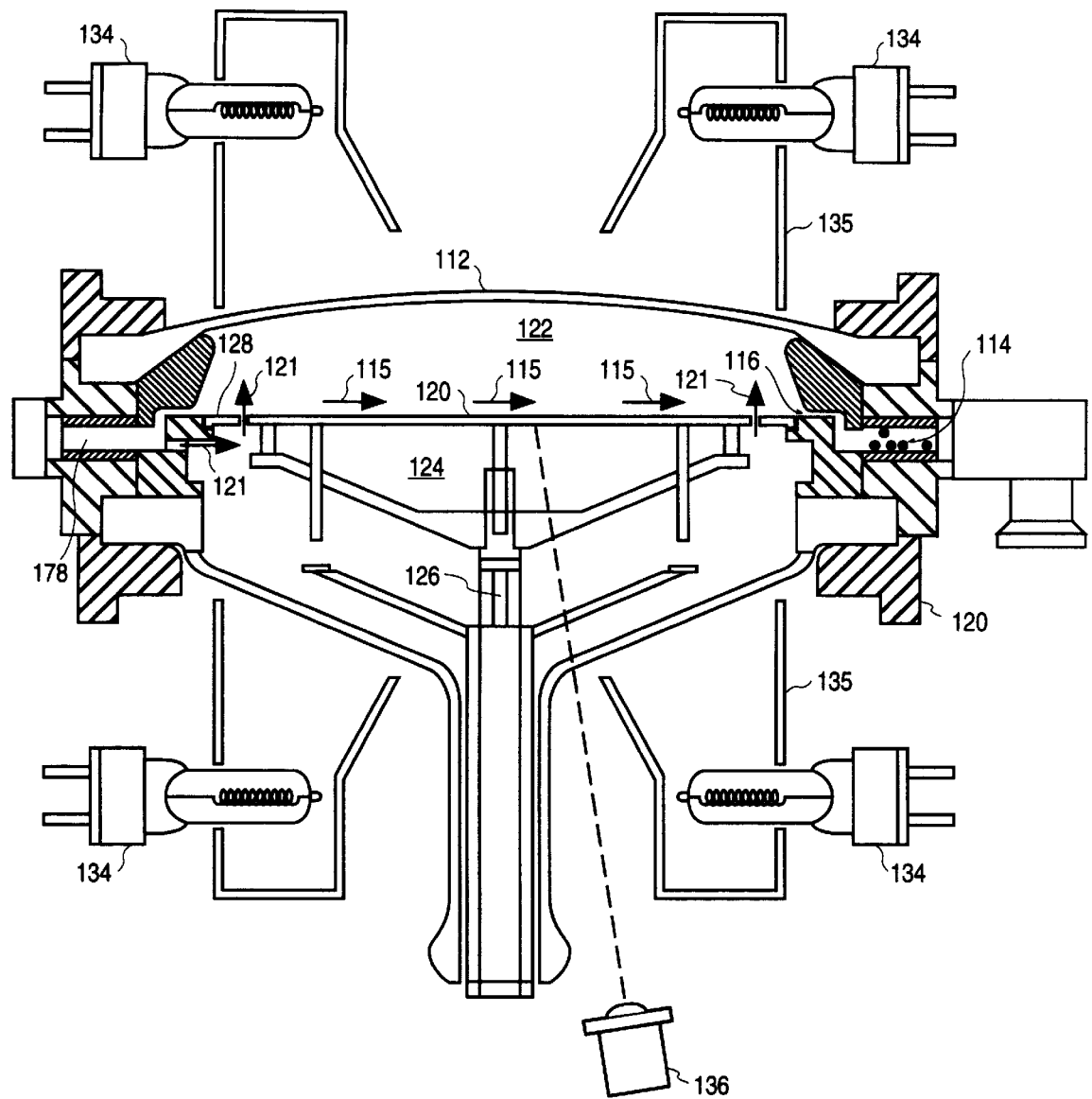
FIG. 1 is an illustration of a cross-sectional view of a single wafer reactor.
Figure 2:
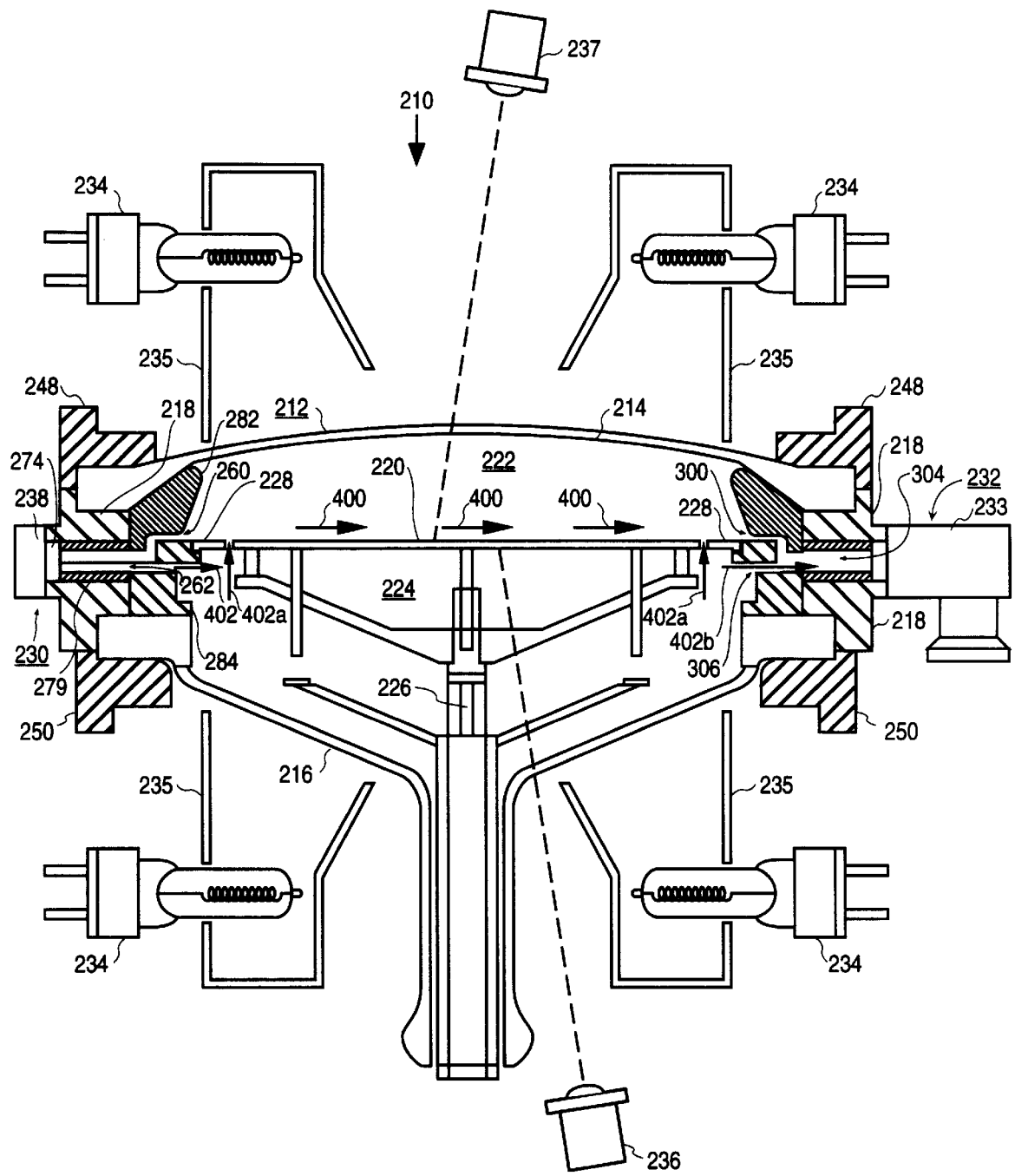
FIG. 2 is an illustration of a single wafer reactor of the present invention.

A semiconductor wafer processing apparatus 210 in accordance with the present invention is shown on FIG. 2. The processing apparatus 210 shown is a deposition reactor and comprises a deposition chamber 212 having an upper dome 214, a lower dome 216 and a side wall 218 between the upper and lower domes 214 and 216. Cooling fluid (not shown) is circulated through sidewall 218 in order to cool "o" rings used to attach domes 214 and 216 to sidewall 218. An upper liner 282 and a lower liner 284 are mounted against the inside surface of sidewall 218. The upper and lower domes 214 and 216 are made of a transparent material to allow heating light to pass there through into the chamber 212.

Within the chamber 212 is a flat, circular susceptor 220 for supporting a wafer. The susceptor 220 extends transversely across the chamber 212 at the side wall 218 to divide the chamber 212 into an upper portion 222 above the susceptor 220 and a lower portion 224 below the susceptor 220. The susceptor 220 is mounted on a shaft 226 which extends perpendicularly downwardly from the center of the bottom of the susceptor 220. The shaft 226 is connected to a motor (not shown) which rotates shaft 226 and thereby rotates the susceptor 220. An annular preheat ring 228 is connected at its outer periphery to the inside periphery of lower liner 284 and extends around the susceptor 220. The pre-heat ring 228 is in the same plane as the susceptor 220 with the inner edge of the pre-heat ring 228 separated by a gap 229 from the outer edge of the susceptor 220. An inlet manifold 230 is positioned in the side of chamber 212 and is adapted to admit gas into the chamber 212. An outlet port 232 is positioned in the side of chamber 212 diagonally opposite the inlet manifold and is adapted to exhaust gases from the deposition chamber 212.

A plurality of high intensity lamps 234 are mounted around the chamber 212 and direct their light through the upper and lower domes 214 and 216 onto the susceptor 220 to heat the susceptor 220. The upper and lower domes 214 and 216 are made of a material which is transparent to the light from the lamps 234, such as clear quartz. The upper and lower domes 214 and 216 are generally made of quartz because quartz is transparent to light of both visible and IR frequencies; it exhibits a relatively high structural strength; and it is chemically stable in the process environment of the deposition chamber 212. Although lamps are the preferred means for heating wafers in deposition chamber 220, other methods may be used such as resistance heaters and RF inductive heaters. An infrared temperature sensor 236 such as a pyrometer is mounted below the lower dome 216 and faces the bottom surface of the susceptor 220 through the lower dome 216. The temperature sensor 236, is used to monitor the temperature of the susceptor 220 by receiving infra-red radiation emitted from the susceptor 220 when the susceptor 220 is heated. A temperature sensor 237 for measuring the temperature of a wafer may also be included if desired.

An upper clamping ring 248 extends around the periphery of the outer surface of the upper domes 214. A lower clamping ring 250 extends around the periphery of the outer surface of the lower dome 216. The upper and lower clamping rings are secured together so as to clamp the upper and lower domes 214 and 216 to the side wall 218.

Reactor 210 includes a deposition gas inlet manifold 230 for feeding deposition gas into chamber 212 deposition. Gas inlet manifold 230 includes a baffle 274, an insert plate 279 positioned within sidewall 218, and a passage 260 formed between upper liner 282 and lower liner 284. Passage 260 is connected to the upper portion 222 of chamber 212. Deposition gas such as a silicon source gas, a dopant source gas and a carrier gas are fed from gas cap 238 through baffle 274, insert plate 279 and passage 260 and into the upper portion 222 of chamber 212.

Reactor 210 also includes an independent inert gas inlet 262 for feeding an inert purge gas, such as but not limited to, Hydrogen ($H_2$) or Nitrogen ($N_2$), into the lower portion 224 of deposition chamber 212. As shown in FIG. 2, inert purge gas inlet 262 can be integrated into gas inlet manifold 230, if desired, as long as a physically separate and distinct passage 262 through baffel 274, insert plate 279, and lower liner 284 is provided for the inert gas, so that the inert purge gas can be controlled and directed independent of the deposition gas. Inert purge gas inlet 262 need not necessarily be integrated or positioned along with deposition gas inlet manifold 230, and can for example be positioned on reactor 210 at an angle of 90° from deposition gas inlet manifold 230.

Figure 3:
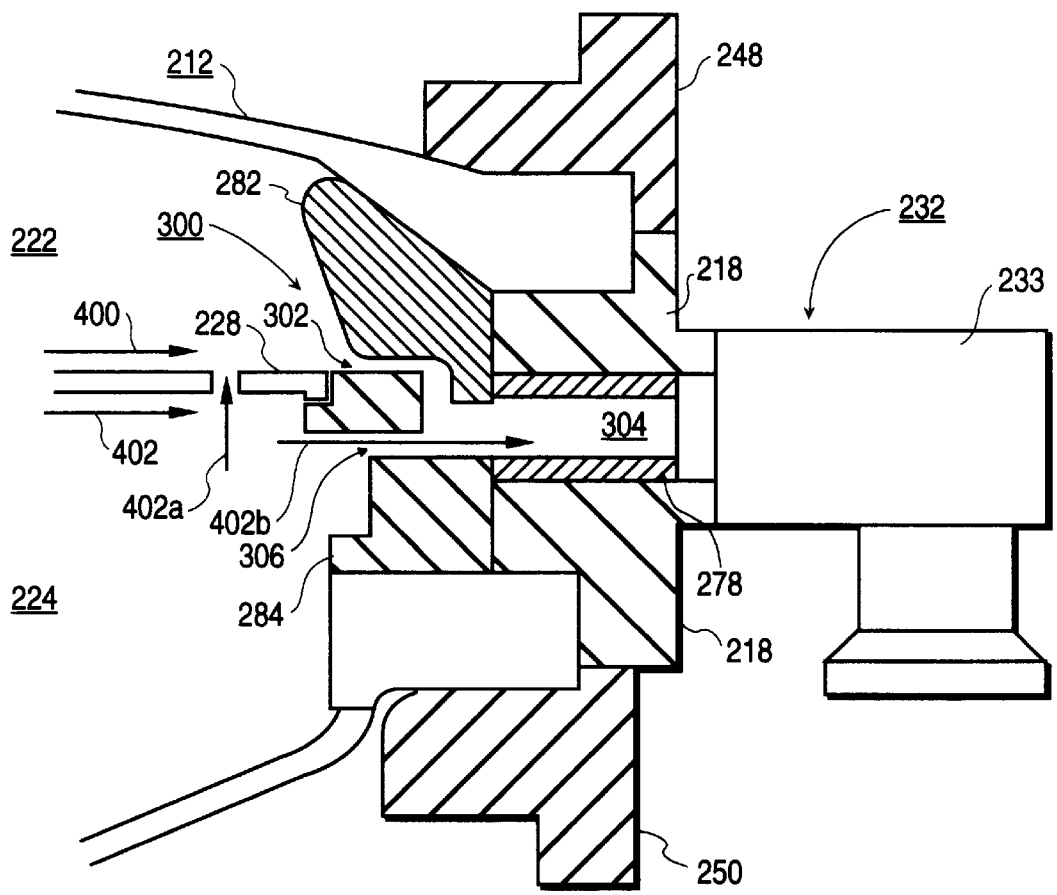
FIG. 3 is an illustration of an expanded cross section view of the gas exhaust outlet of the single wafer reactor of the present invention.

A side cross-sectional view of an embodiment of the gas outlet 232 of the single wafer reactor of the present invention is shown in FIG. 3. The gas outlet 232 includes an exhaust passage 300 which extends from the upper chamber portion 222 to the outside diameter of sidewall 218. Exhaust passage 300 includes an upper passage 302 formed between upper liner 282 and lower liner 284 and which extends between the upper chamber portion 222 and the inner diameter of sidewall 218. Additionally, exhaust passage 300 includes an exhaust channel 304 formed within insert plate 278 positioned within sidewall 218. A vacuum source, such as a pump (not shown) for creating low or reduced pressure in deposition chamber 212 is coupled to exhaust channel 304 on the exterior of sidewall 218 by an outlet pipe 233. Thus, deposition gas fed into the upper chamber portion 222 is exhausted through the upper passage 302, through exhaust channel 304 and into outlet pipe 233.

The single wafer reactor shown in FIG. 2 is a "cold wall" reactor. That is, sidewall 218 and upper and lower liners 282 and 284, respectively, are at a substantially lower temperature than susceptor 220 (and a wafer placed thereon) during processing. For example, in a process to deposit an epitaxial silicon film on a wafer, the susceptor and wafer are heated to a temperature of between 900–1200° C. while the sidewall (and liners) are at a temperature of about 400–600° C. The sidewall and liners are at a cooler temperature because they do not receive direct irradiation from lamps 234 due to reflectors 235, and because cooling fluid is circulated through sidewall 218.

Gas outlet 232 also includes a vent 306 which extends from the lower chamber portion 224 through lower liner 284 to exhaust passage 300. Vent 306 preferably intersects the upper passage 302 of exhaust passage 300 as shown in FIG. 3. Inert purge gas is exhausted from the lower chamber portion 224 through vent 306, through a portion of upper chamber passage 302, through exhaust channel 304, and into outlet pipe 232. Vent 306 allows for the direct exhausting of purge gas from the lower chamber portion to exhaust passage 300.

According to the present invention, deposition gas or gases 400 are fed into the upper chamber portion 222 from gas inlet manifold 230. A deposition gas, according to the present invention, is defined as gas or gas mixture which acts to deposit a film on a wafer or a substrate placed in chamber 212. In the preferred method of the present invention deposition gas is used to deposit a silicon epitaxial layer on a wafer placed on susceptor 220. Deposition gas 400 generally includes a silicon source, such as but not limited to, monosilane, trichloralsilane, dichloralsilane, and tetrachlorolsilane, and a dopant gas source, such as but not limited to phosphene, diborane and arsine. A carrier gas, such as $H_2$, is generally included in the deposition gas stream. For an approximately 5 liter deposition chamber, a deposition gas stream between 35–75 SLM (including carrier gas) is typically fed into the upper chamber portion 222 to deposit a layer of silicon on a wafer. The flow of deposition gas 400 is essentially a laminar flow from inlet passage 260, across preheat ring 228, across susceptor 220 (and wafer), across the opposite side of preheat ring 228, and out exhaust passage 300. The deposition gas is heated to a deposition or process temperature by preheat ring 228 susceptor 220, and the wafer being processed. In a process to deposit an epitaxial silicon layer on a wafer, the susceptor and preheat ring are heated to a temperature of between 800–1200° C.

Additionally, while deposition gas is fed into the upper chamber portion, an inert purge gas or gases 402 are fed independently into the lower chamber portion 224. An inert purge gas is defined as a gas which is substantially unreactive at process temperatures with chamber features and wafers placed in deposition chamber 212. The inert purge gas is heated by preheat ring 228 and susceptor 220 to essentially the same temperature as the deposition gas while in chamber 212. Inert purge gas 402 is fed into the lower chamber portion 224 at a rate which develops a positive pressure within lower chamber portion 224 with respect to the deposition gas pressure in the upper chamber portion 222. Film Deposition gas 400 is therefore prevented from seeping down through gap 229 and into the lower chamber portion 224, and depositing on the back side of susceptor 220.

Additionally, inert purge gas 402 is fed into the lower chamber portion 224 at a rate which provides a sufficient flow of inert purge gas 402b through vent 306 and into exhaust passage 300 to prevent deposition gas from condensing in exhaust channel 304 of exhaust passage 300 and forming deposits therein. That is, a sufficient amount of heated purge gas is fed into exhaust channel 304 to heat exhaust channel 304, and thereby prevent the cooling of deposition gas 400 in exhaust channel 304 and the resulting formation of deposits therein. It is to be appreciated that without the high flow rate of heated purge gas 402b into the exhaust channel 304, the exhaust channel 304 would be substantially cooler than susceptor 220 due to the water cooling of sidewall 218, and deposits would form therein. Thus, according to the present invention, a high flow rate 402b, preferably between 2–24 SLM, of inert purge gas is fed into the lower portion 224 of chamber 212, in order to prevent deposition gas from seeping down through gap 229 and to prevent deposition gas from condensing in the exhaust channel 304.

Figure 5A:
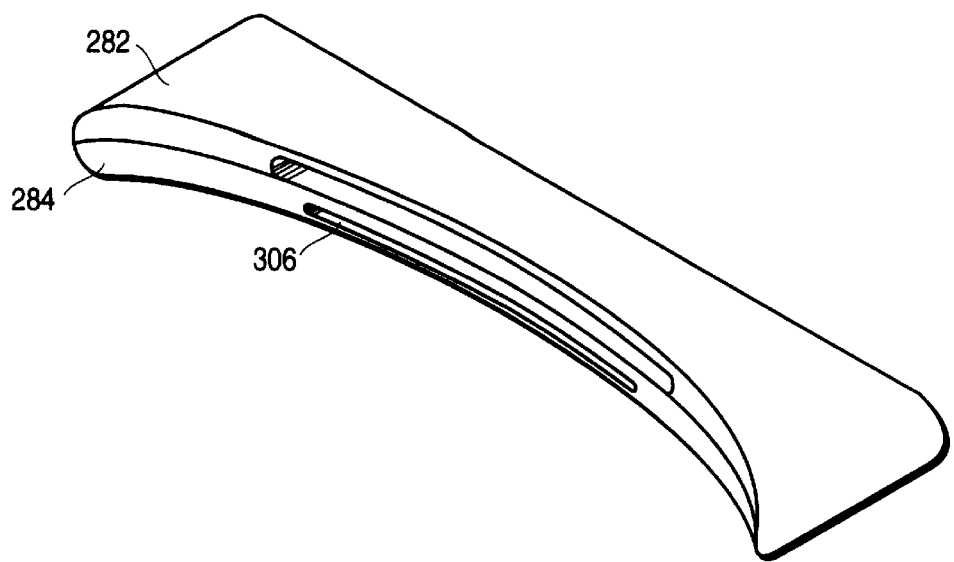
FIG. 5a is an illustration of a frontal view of the vent and exhaust passage of an embodiment of the present invention.
Figure 5B:
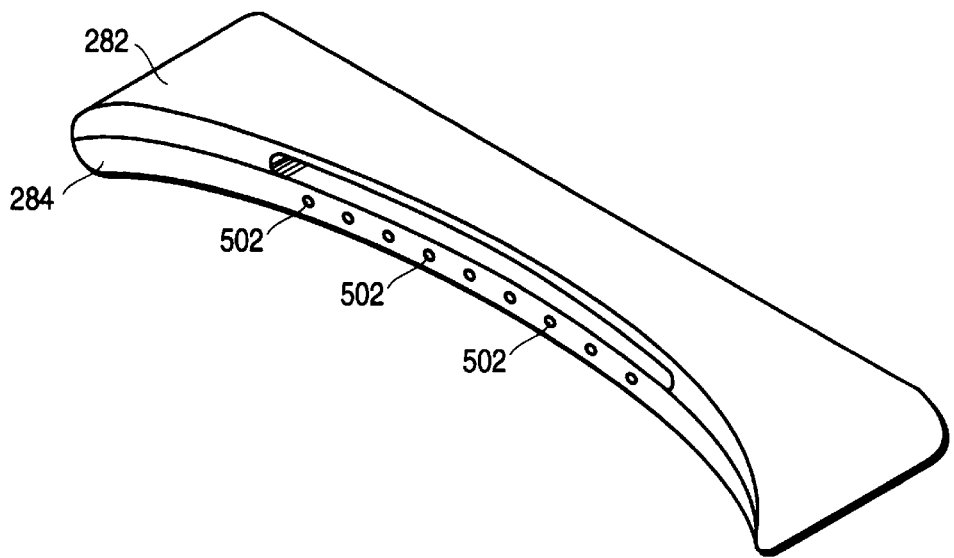
FIG. 5b is an illustration of a frontal view of the vent and exhaust passage of another embodiment of the present invention.

FIGS. 5a and 5b show frontal cross-sectional views of two of many possible configurations for vent 306. For example, as shown in FIG. 5a, vent 306 can be located directly beneath upper passage 302 and consist of a single cross-sectional opening formed in the inner curved surface of lower liner 284. The cross-sectional opening into chamber 222 is preferably at least as long as the diameter of the processing area on susceptor 220. In another embodiment, as shown in FIG. 5b, vent 306 can consist of a plurality of discreet holes or passages 502 formed in the inner curved surface of lower liner 284 and which are each coupled to exhaust passage 300. The shape of vent 306 should be such that it provides little affect on the laminar flow of deposition gas 400 in the upper portion 222 of chamber 212.

Figure 4:
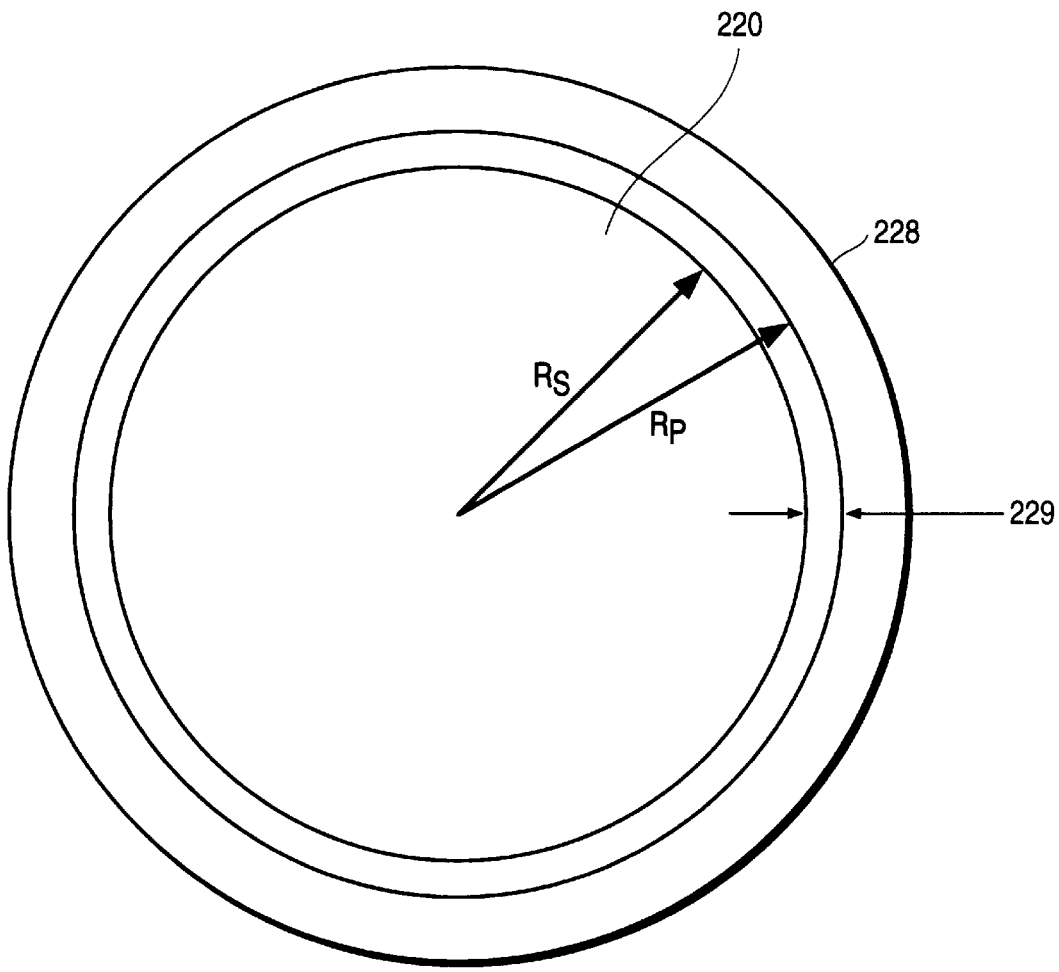
FIG. 4 is an illustration of an overhead view of the susceptor and preheat member of the single wafer reactor of the present invention.

The relative flow rates 402a and 402b through gap 229 and vent 306, respectively, are governed by the ratio of the cross-sectional area of gap 229 and the cross-sectional area of vent 306. In the preferred embodiment of the present invention as shown in FIG. 4, where the preheat ring and susceptor are coplanar, the cross-sectional area of gap 229 is the area defined by the enclosed area of preheat ring 228 minus the area of susceptor 220 (i.e., $\pi R_P^2 - \pi_S^2$). If susceptor 220 and preheat ring 228 are interleavened then the relevant cross-sectional area is the smallest surface area which exists between preheat ring 228 and susceptor 220. The cross-sectional area of vent 306 is defined as the total surface area of vent 306 which opens into lower chamber portion 224. In the case of a plurality of discreet passages as shown in FIG. 5b, the relevant cross-section area is the sum of the areas of each opening 502.

According to the present invention, the cross-sectional area of vent 229 is maximized so as to exhaust as much of the purge gas flow as possible through vent 306. In this way a sufficient amount of heated inert purge gas is provided to prevent deposition gas from condensing in the exhaust passage. The cross-sectional area of vent 306 is dictated by two requirements. First, the cross-sectional area of vent 306 cannot be so large so as to affect the mechanical strength and integrity of lower liner 284. Additionally, the ratio of cross-sectional area of gap 229 and vent 306 must be balanced so that the inert purge gas flow 402a through gap 229 is sufficient to prevent the diffusion of deposition gases from the upper chamber portion 222 into the lower chamber portion 224. A gap 229 to vent 306 cross-sectional area ratio of approximately 3:1 has been found to provide good results for a deposition gas flow of between 45–70 slm and a purge gas flow of greater than 12 slm in a five liter chamber.

An apparatus and method for preventing condensation of deposition gas in an exhaust passage of a deposition apparatus has been described. It is to be appreciated and understood that the specific embodiments of the invention described herein are merely illustrative of the general principles of the invention. Various modifications may be made consistent with the principles set forth. For example, although the present invention has been described with respect to a single substrate reactor for depositing a silicon film on a semiconductor wafer, the present invention is equally applicable for use in other machinery such as multi-wafer chambers, and for other substrates, such as substrates for flat panel displays, and for other films such as metals. As such, the scope of the present invention is to be measured by the appended claims which follow.

Thus, a novel method and apparatus for preventing the condensation an exhaust gas in an exhaust passage has been described.

We claim:

1. A method of depositing a film on a wafer in a single wafer coldwall reactor comprising:

placing a wafer on a susceptor which divides a coldwall deposition chamber having a sidewall into an upper chamber portion and a lower chamber portion;

flowing a deposition gas into said upper chamber portion, across said wafer, and out through an exhaust passage extending from said upper chamber through said sidewall;

flowing a purge gas into said lower chamber portion and out through a lower passage extending from said lower chamber portion to said exhaust passage;

heating said purge gas while in said lower portion of said chamber to form a heated purge gas; and flowing said heated purge gas through said lower passage at a rate that prevents said deposition gas from condensing in said exhaust passage.

2. A method of depositing a film on a wafer in a single substrate coldwall reactor comprising:

placing a wafer on a susceptor positioned within a coldwall deposition chamber having a sidewall, said susceptor dividing said coldwall deposition chamber into an upper portion which is above said wafer, and a lower portion which is below said wafer;

flowing a deposition gas into said upper portion of said deposition chamber;

exhausting said deposition gas through an exhaust passage extending from said upper portion of said deposition chamber through said sidewall;

flowing a purge gas into said lower portion of said coldwall deposition chamber wherein said flow of purge gas substantially prevents said coldwall deposition gas from flowing into said lower portion of said deposition chamber through a gap between said susceptor and a preheat member which surrounds said susceptor plate;

heating said purge gas with said susceptor and said preheat member; and exhausting said heated purge gas through a lower passage extending from said lower portion of said chamber to said exhaust passage wherein said heated purge gas prevents said deposition gas in said exhaust passage from condensing.

3. The method of claim 2 wherein said lower passage has a cross-sectional area and wherein said gap has a cross-sectional area and wherein the cross sectional area of said lower passage relative to the cross sectional area of said gap is balanced so that the purge gas flow through said gap is sufficient to prevent diffusion of said deposition gas from said upper chamber portion to said lower chamber portion through said gap.

4. The method of claim 3 wherein wherein said lower passage has a first cross-sectional area and wherein said gap has a second cross-sectional area and wherein the ratio of said first cross sectional area to said second cross sectional area is approximately 3:1.

5. The method of claim 2 wherein said purge gas has a flow rate of greater than 12 slm into said lower portion of said chamber.

6. The method of claim 2 wherein the deposition gas has a flow rate of between 45–70 slm and said purge gas has a flow rate of greater than 12 slm.

* * * * *